(12) United States Patent
Blaum et al.

(10) Patent No.: US 10,014,881 B2
(45) Date of Patent: Jul. 3, 2018

(54) MULTIPLE ERASURE CODES FOR DISTRIBUTED STORAGE

(71) Applicant: International Business Machines Corporation, Armonk, NY (US)

(72) Inventors: Mario Blaum, San Jose, CA (US); James L. Hafner, Pacific Grove, CA (US); David A. Pease, Redwood Estates, CA (US); Mohit Saxena, San Jose, CA (US); Mingyuan Xia, Montreal (CA)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 15/363,606

(22) Filed: Nov. 29, 2016

(65) Prior Publication Data
US 2017/0077961 A1    Mar. 16, 2017

Related U.S. Application Data

(63) Continuation of application No. 14/600,532, filed on Jan. 20, 2015, now Pat. No. 9,595,979.

(51) Int. Cl.
*H03M 13/35* (2006.01)
*H03M 13/37* (2006.01)
(Continued)

(52) U.S. Cl.
CPC .......... *H03M 13/356* (2013.01); *G06F 3/064* (2013.01); *G06F 3/0619* (2013.01);
(Continued)

(58) Field of Classification Search
CPC .................................................. H04L 1/0009
(Continued)

(56) References Cited

U.S. PATENT DOCUMENTS 5,321,703 A * 6/1994 Weng ...................... G06F 11/10
                                                          714/761
6,160,840 A * 12/2000 Park ...................... H03M 13/23
                                                          375/141
(Continued)

FOREIGN PATENT DOCUMENTS

WO    2006013529      2/2006
WO    20090127987    10/2009
(Continued)

OTHER PUBLICATIONS

Defenders et al., Reliable, Scalable, and High-Performance Distributed Storage: Data Distribution, ip.com Electronic Publication, Feb. 19, 2014, pp. 1-8, An ip.com Prior Art Database Technical Disclosure.

(Continued)

*Primary Examiner* — Fritz Alphonse
(74) *Attorney, Agent, or Firm* — Lieberman & Brandsdorfer, LLC

(57) ABSTRACT

Embodiments relate to dynamically selecting an erasure code. State data is tracked to ascertain frequency of file access. One of at least two erasure codes are selected based on the tracked state data in order to lower data recovery cost. The erasure code may be selected as either a product code or a local reconstruction code. Each erasure code includes a mode that is either a fast code or a compact code. The fast code features a low recovery cost and the compact code features a low storage overhead for less frequently accessed data. Data is encoded with one of the selected erasure codes and one of the modes of the selected erasure code. Data blocks are dynamically converted between the fast and compact codes of the selected erasure code responsive to a workload change.

18 Claims, 12 Drawing Sheets

(51) Int. Cl.
    G06F 11/10    (2006.01)
    G06F 3/06     (2006.01)
    H03M 13/15    (2006.01)
    H03M 13/29    (2006.01)
(52) U.S. Cl.
    CPC ........ G06F 3/0673 (2013.01); G06F 11/1048 (2013.01); G06F 11/1076 (2013.01); H03M 13/154 (2013.01); H03M 13/2909 (2013.01); H03M 13/35 (2013.01); H03M 13/373 (2013.01); H03M 13/3707 (2013.01)
(58) Field of Classification Search
    USPC .......................................... 714/774, 761, 758
    See application file for complete search history.

(56) References Cited

U.S. PATENT DOCUMENTS

| | | | |
|---|---|---|---|
| 7,050,419 B2 * | 5/2006 | Azenkot ................. | H04L 5/026 370/347 |
| 8,386,838 B1 | 2/2013 | Byan | |
| 2005/0210179 A1 * | 9/2005 | Walmsley ............ | B41J 2/04505 711/3 |
| 2006/0129873 A1 * | 6/2006 | Hafner ................. | G06F 11/1076 714/5.1 |
| 2009/0319859 A1 | 12/2009 | Alrod et al. | |
| 2010/0218037 A1 | 8/2010 | Swartz et al. | |
| 2012/0017140 A1 | 1/2012 | Wylie et al. | |
| 2012/0221926 A1 | 8/2012 | Blaum et al. | |
| 2014/0380088 A1 | 12/2014 | Bennett et al. | |
| 2015/0074487 A1 * | 3/2015 | Patapoutian ......... | G06F 11/1012 714/758 |
| 2015/0236724 A1 | 8/2015 | Reinart | |
| 2015/0347231 A1 | 12/2015 | Gopal et al. | |

FOREIGN PATENT DOCUMENTS

| | | |
|---|---|---|
| WO | 2012068184 | 5/2012 |
| WO | 2013191658 | 12/2013 |

OTHER PUBLICATIONS

Cai et al., High Reliability and Flexibility Storage Cluster in Decentralized Organization, 2006 International Workshop on Networking, Architecture, and Storage, pp. 194-202.
Anonymous, Method for I/O Performance Improvement in Erasure Code Environment, ip.com Electronic Publication, Jun. 10, 2013, pp. 1-8, An ip.com Prior Art Database Technical Disclosure.
Anonymous, Cleversafe Reliability, Alternative to RAID, Copyright 2015 Cleversafe, Inc.
Fikes, Storage Architecture and Challenges in Faculty Summit, Jul. 29, 2010, pp. 1-25.
Anonymous, HDFS RAID, Hadoop Wiki, http://wiki.apache.org/hadoop/HDFS-RAID, Last edited Nov. 2, 2011 19:58:41 by MaheswaranSathiamoorthy.
Anonymous, Hadoop Distributed File System, http://wiki.apache.org/hadoop/HDFS, Last edited Feb. 21, 2014 04:14:22 by SteveKallestad.
Chen, What Do Real-Life Apache Hadoop Workloads Look Like?. Sep. 5, 2012, Blog.
Fadden, An Introduction to GPFS Version 3.5, Technologies that enable the management of big data, International Business Machines Corporation, Aug. 2012, pp. 1-23.
Abad et al., A Storage-Centric Analysis of MapReduce Workloads: File Popularity, Temporal Locality and Arrival Patterns, Conference Paper, IEEE International Symposium on Workload Characterization (IISWC) 2012, pp. 100-109.
Blaum et al., Partial-MDS Codes and Their Application to RAID Type of Architectures, In Proceedings of IEEE Transactions on Information Theory, vol. 59, No. 7, Jul. 2013, pp. 4510-4519.
Chen et al., Interactive Analytical Processing in Big Data Systems: A Cross-Industry Study of MapReduce Workloads, Proceedings of the VLDB Endowment, Aug. 2012, vol. 5, No. 12, pp. 1802-1813.
Fan et al., DiskReduce: RAID for Data-Intensive Scalable Computing, Supercomputing PDSW '09, Nov. 15, 2009. Portland, OR, USA, pp. 6-10.
Ghemawat et al., The Google File System, Symposium on Operating Systems Principles '03, Oct. 19-22, 2003, Bolton Landing, New York, USA, pp. 29-43.
Hafner et al., HoVer Erasure Codes for Disk Arrays, International Business Machines Corporation Research Report, 2006 International Conference on Dependable Systems and Networks, pp. 217-226.
Hafner et al., Notes on Reliability Models for Non-MDS Erasure Codes, International Business Machines Corporation Research Resport, RJ10391, 2006, pp. 1-16.
Huang et al., Pyramid Codes: Flexible Schemes to Trade Space for Access Efficiency in Reliable Data Storage Systems, ACM Trans. Storage 9, 1, Article 3 (Mar. 2013), pp. 3:1-3:28.
Huang et al., Erasure Coding in Windows Azure Storage, In Proceedings of the 2012 USENIX Conference on Annual Technical Conference, 2012, pp. 1-12.
Khan et al., Rethinking Erasure Codes for Cloud File Systems: Minimizing I/O for Recovery and Degraded Reads, 2012, In FAST-2012: 10th USENIX Conference on File and Storage Technologies, pp. 20-20.
Luse et al., Swift Object Storage: Adding Erasure Codes, SNIA Education, Sep. 2014, Storage Networking Industry Association, pp. 1-36.
Plank et al., Screaming Fast Galois Field Arithmetic Using Intel SIMD Instructions, Appearing in FAST 2013: 11th USENIX Conference on File and Storage Technologies, Feb. 2013, pp. 299-306.
Rashmi et al., A Solution to the Network Challenges of Data Recovery in Erasure-coded Distributed Storage Systems: A Study on the Facebook Warehouse Cluster, Presented as part of the 5th USENIX Workshop on Hot Topics in Storage and File Systems, 2013, pp. 1-5.
Rashmi et al., A "Hitchhiker's" Guide to Fast and Efficient Data Reconstruction in Erasure-coded Data Centers, SIGCOMM'14, Aug. 17-22, 2014, Chicago, USA, pp. 331-342.
Reed et al., Polynomial Codes Over Certain Finite Fields, Journal of the Society for Industrial and Applied Mathematics, vol. 8, No. 2, Jun. 1960, pp. 300-304.
Ren et al., Hadoop's Adolescence: An Analysis of Hadoop usage in Scientific Workloads, The 39th International Conference on Very Large Data Bases, Aug. 26-30, 2013, Riva del Garda, Trento, Italy, Proceedings of the VLDB Endowment, vol. 6, No. 10, pp. 853-864.
Lin et al., Error Control Coding: Fundamentals and Applications, Englewood Cliffs, N.J, Prentice Hall Professional Technical Reference, Feb. 27, 1983, 1st edition, Section 9.6, pp. 274-276.
Sathiamoorthy et al., XORing Elephants: Novel Erasure Codes for Big Data, The 39th International Conference on Very Large Data Bases, Aug. 26 30, 2013, Riva del Garda, Trento, Italy Proceedings of the VLDB Endowment, vol. 6, No. 5, pp. 325-336.
Schmuck et al., GPFS: A Shared-Disk File System for Large Computing Clusters, USENIX Association, Proceedings of the FAST 2002 Conference on File and Storage Technologies, Monterey, CA, USA, Jan. 28-30, 2002.
Tamo et al., A Family of Optimal Locally Recoverable Codes, IEEE Transactions on Information Theory, vol. 60, No. 8, 2014, pp. 4661-4676.
Wilkes et al., The HP AutoRAID Hierarchical Storage System, ACM Transactions on Computer Systems, vol. 14, No. 1, Feb. 1996, pp. 108-136.
List of IBM Patents or Applications Treated as Related, Nov. 2016.

* cited by examiner

MULTIPLE ERASURE CODES FOR DISTRIBUTED STORAGE

CROSS REFERENCE TO RELATED APPLICATION(S)

This application is a continuation patent application claiming the benefit of the filing date of U.S. patent application Ser. No. 14/600,532 filed on Jan. 20, 2015 and titled "Multiple Erasure Codes for Distributed Storage," now pending, and which is hereby incorporated by reference.

BACKGROUND

The present embodiments relate to a new erasure coded storage system that adapts to workload changes by using two different erasure codes, including a fast code to optimize recovery cost of degraded reads and reconstruction of failed disks or nodes, and a compact code to provide low and bounded storage overhead. More specifically, the embodiments relates to a conversion mechanism to efficiently upcode and downcode data blocks between the two codes.

Distributed storage systems storing multiple petabytes of data are becoming common. These systems have to tolerate different failures arising from unreliable components, software glitches, machine reboots, and maintenance operations. To guarantee high reliability and availability despite these failures, data is replicated across multiple machines. For example, it is known in some systems to maintain three copies of each data block. Although disk storage is relatively inexpensive, replication of the entire data footprint is infeasible at massive scales of operation.

Many large scale distributed storage systems are transitioning to the use of erasure codes, which are known to provide high reliability at lower storage cost. These systems use a single erasure code, which either optimizes for recovery cost or storage overhead. However, for an erasure coded system, reconstructing an unavailable block requires fetching multiple data and parity blocks within the code stripe, which results in an increase in disk and network traffic. The increase in the amount of data to be read and transferred during recovery for an erasure-coded system results in high degraded read latency and longer reconstruction time.

SUMMARY

The embodiments include a system, computer program product, and method for dynamically selecting an erasure code in a storage system, and responsively converting data blocks between different erasure codes.

A system, computer program product, and method are provided for dynamically selecting an erasure code. State data is tracked to ascertain frequency of file access. One of at least two erasure codes are selected based on the tracked state data in order to lower data recovery cost. The erasure code may either a product code or a local reconstruction code, with each erasure code having an associated mode that is either a fast code or a compact code. The fast code features a low recovery cost and the compact code features a low storage overhead for less frequently accessed data. Data is encoded with one of the selected erasure codes and one of the modes of the selected erasure code. Data blocks are dynamically converted between the fast and compact codes of the selected erasure code responsive to a workload change.

Other features and advantages will become apparent from the following detailed description of the presently preferred embodiment(s), taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments and not of all embodiments unless otherwise explicitly indicated.

DETAILED DESCRIPTION

It will be readily understood that the components of the present embodiment(s), as generally described and illustrated in the Figures herein, may be arranged and designed in a wide variety of different configurations. Thus, the following detailed description of the embodiments of the apparatus, system, and method, as presented in the Figures, is not intended to limit the scope, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

Erasure coding is a method of data protection in which data is broken into fragments, expanded and encoded with redundant pieces, and typically stored across a set of different locations, such as disks, storage nodes or geographic locations. Embodiments disclosed herein pertain to an erasure-coded storage system which uses two different erasure codes from the same code family. The erasures codes described herein are referred to as a fast code and a compact code. The fast code has a low recovery cost for a small fraction of frequently accessed data, and the compact code has low storage overhead for a majority of less frequently accessed data.

At the same time, embodiments disclosed herein pertain to operations for converting data between the two erasure codes. After initial encoding, the aspect of converting the data dynamically adapts to workload changes by using two operations to convert data blocks between the fast code and the compact code. The two operations are referred to as upcoding and downcoding. Upcoding refers to converting data blocks initially encoded with fast code into a compact code and enables the system to reduce storage overhead. Downcoding refers to converting data blocks initially encoded with the compact code to a fast code representation to lower associated recovery cost. In one embodiment, operations associated with upcoding and downcoding only update the associated parity blocks while converting data blocks between the two codes. The coding of the data blocks is dynamic in that a conversion mechanism adaptively responds to system states, and more specifically changes therein. The coding and upcodes or downcodes associated data blocks responsive to the changes.

Figure 1:
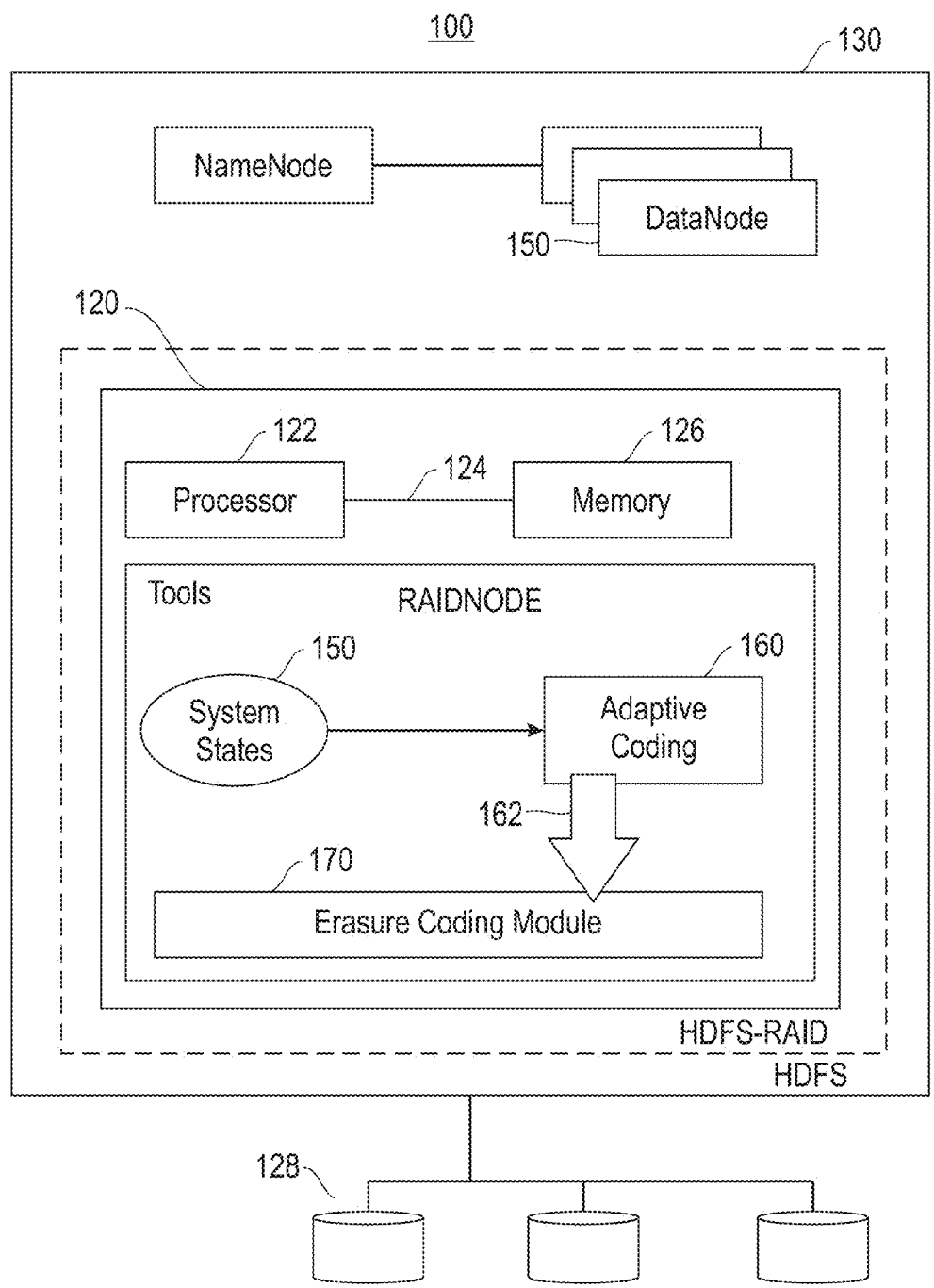
FIG. 1 depicts a block diagram illustrating components of an adaptively coded distributed file system architecture implemented as extensions to a distributed file system.

Referring to FIG. 1, a block diagram (100) is provided illustrating components of an adaptively coded distributed file system architecture implemented as extensions to a distributed file system. The adaptive system is shown as an extension to a RAID node (120) within a distributed file system (130). The node (120) is provided with a processor (122), also referred to herein as a processing unit, in communication with memory (126) across a bus (124). The node (120) is further provided in communication with other nodes (135), which are each in communication with persistent storage (128). Node (120) is responsible for the storage and maintenance of data in persistent storage (128). More specifically, node (120) is provided with one or more tools to support dynamic selection of an erasure code for data in a storage system. As shown herein, and described in detail below, the tools embody an adaptive system comprised of three components, including system states module (150), an adaptive coding module (160) and an erasure coding module (170). The adaptive coding module (160) maintains the system states module (150) of erasure coded data and manages state transitions for ingested and stored data. The adaptive coding module (160) also interfaces (162) with the erasure coding module (170), which functions to implement the different coding schemes.

The system states module (150) track the following file state associated with each erasure-coded data file: file size, last modification time, read count, and coding state. The file size and last modification time are attributes maintained by the distributed file system, and used by the adaptively coded distributed file system to compute the total data storage and write age of the file. The adaptive coding module (160) also tracks the read count of a file, which is the total number of read accesses of the file by the distributed file system clients. The file state can be updated on a read or write operation issued to the file from a distributed file system client.

The adaptive coding module (160) also maintains a global state, which is the total storage used for data and parity. Every block in an erasure coded data file has exactly one copy. Each erasure coded file is split into different erasure code stripes, with blocks in each stripe distributed across different nodes in the distributed file system cluster. Each erasure coded data file has an associated parity file whose size is determined by the coding scheme. The global state of the system is updated periodically when the adaptive coding module (160) initiates state transitions for erasure coded files. A state transition corresponds to a change in the coding state of a file and is invoked by using interfaces to the erasure coding module.

The erasure coding module (170) exports four interfaces for coding data, including encode, decode, upcode and downcode. The encode operation requires a data file and coding scheme as input, and generates a parity file for all blocks in the data file. The decode operation is invoked on a degraded read for a block failure or as part of the reconstruction job for a disk or node failure. It also requires the index of a missing or corrupted block in a file, and reconstructs the associated lost block from the remaining data and parity blocks in the stripe using the input coding scheme. The following table illustrates the erasure coding interfaces:

TABLE 1

| Function | Input | Output |
| --- | --- | --- |
| Encode | Data file; codec | Parity file |
| Decode | Data file; parity file, codec, lost block index | Recovered block |
| Upcode | Parity file, original fast codec, new compact codec | Parity file encoded with compact code |
| Downcode | Data file, parity file, original compact code, new fast codec | Parity file encoded with fast code |

The adaptive coding module (160) invokes upcode and downcode operations to adapt with workload changes and convert a data file representation between the two coding schemes. In one embodiment, both of these conversion operations only update the associated parity file when changing the coding scheme of a data file. The upcode operation transforms data from a fast code to a compact code representation, thus reducing the size of the parity file to achieve lower storage overhead. The upcode operation does not require reading the data file and is a parity-only transformation. The downcode operation transforms from a compact code to a fast code representation, thus reducing the recovery cost. The downcode operation requires reading both data and parity files, but only changes the parity file.

Figure 2:
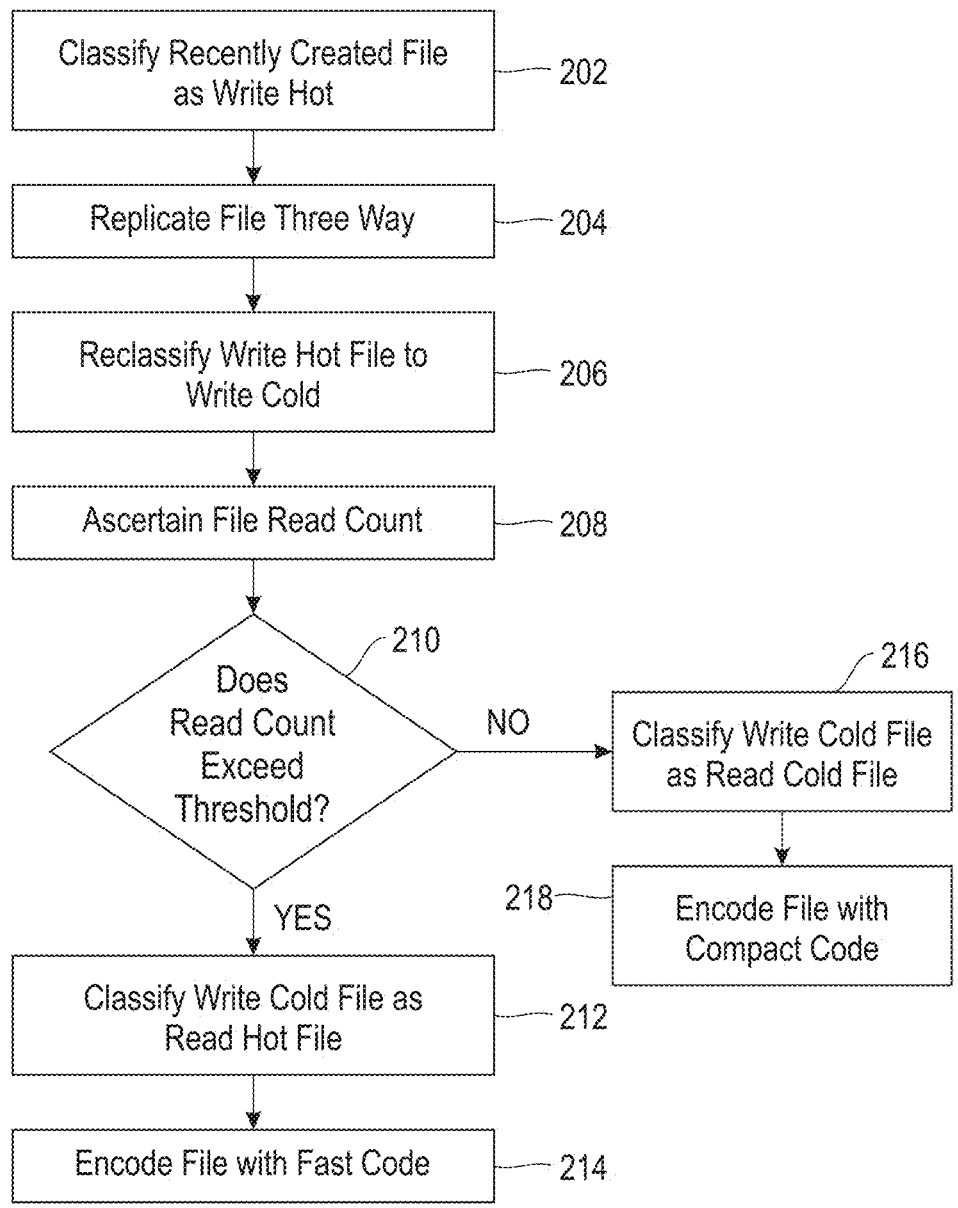
FIG. 2 depicts a flow chart illustrating a first extension of the adaptively coded distributed file system.

Referring to FIG. 2, a flow chart (200) is provided illustrating a first extension of the adaptively coded distributed file system. A recently created file is classified as a write hot file based on its last modified write time (202). The write hot file is three way replicated (204). At such time as the write accesses decrease below a set number of accesses, the write hot file is reclassified to a write cold file (206). In one embodiment, the file system is periodically scanned to select write cold files for erasure coding. Each write cold file is also classified based on the quantity of read access of data blocks in a file. More specifically, a read count for the file is ascertained (208), and as demonstrated herein, it is determined if the read count on the write cold file exceeds a threshold (210). In one embodiment, the assessment may be inverted to determine if the read count is below a threshold. A positive response to the determination at step (210) is followed by classifying the write cold file as a read hot file (212), and the file is encoded with a fast code (214). In one embodiment, the fast code has a low recovery cost. A negative response to the determination at step (212) is followed by classifying the write cold file as a read cold file (216), indicating the file has a low read count. Thereafter, the file is encoded with a compact code (218), which in one embodiment has a low storage overhead. Accordingly, each write cold file is encoded based on an associated read count, with the encoded reflecting the frequency of read accesses to the file.

Figure 3:
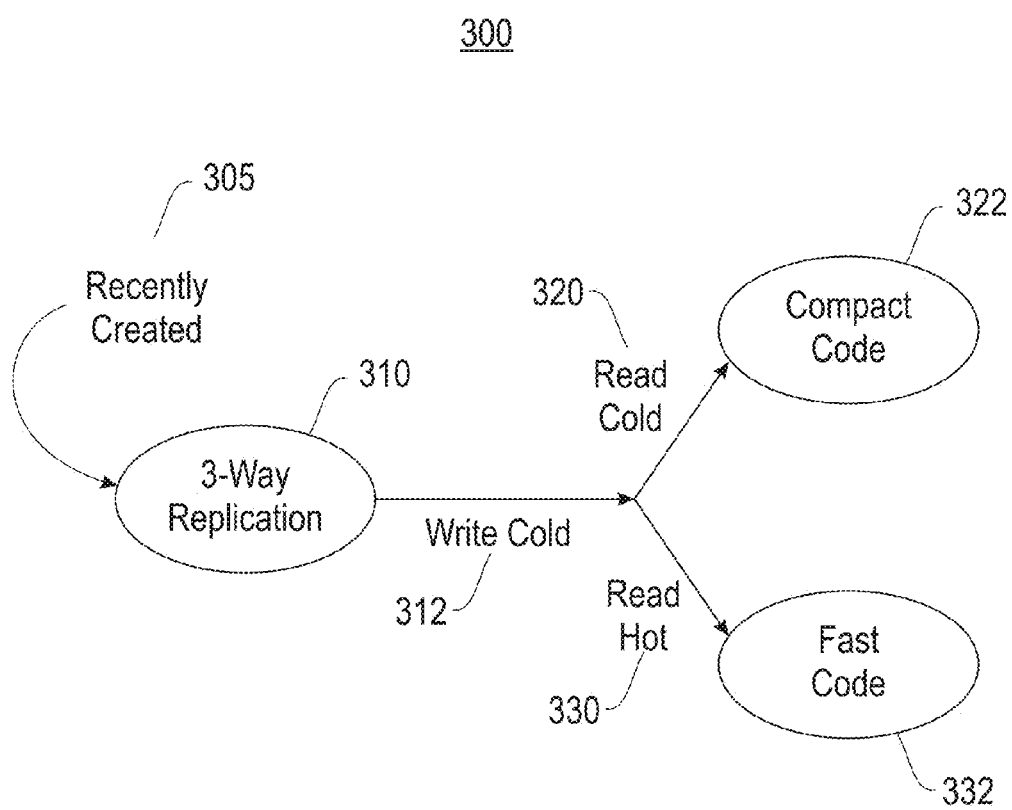
FIG. 3 depicts a state diagram illustrating two erasure codes for write cold files.

Referring to FIG. 3, a state diagram (300) is provided illustrating two erasure codes for write cold files. As shown, a recently created file is classified as write hot and is three way replicated (310). At such time as modifications to the file decreases, the file is reclassified to a write cold file (312). Each write cold file is encoded with an erasure code based on the read accesses, also referred to herein as a read count. Namely, a read cold file (320) is encoded with a compact code (322), and a read hot file (330) is encoded with a fast code (332).

As shown in FIG. 2 and FIG. 3, two different erasure codes are employed to initially encode a write cold file, using a fast code with low recovery cost for a small fraction of frequently accessed data, and a compact code with low storage overhead for a majority of less frequently accessed data. However, a read cold file can transition into a read hot file through later accesses, thereby requiring a lower recovery cost, and a read hot file can transition into a read cold file through a decrease in accesses, thereby requiring enabling a higher recovery cost.

Figure 4:
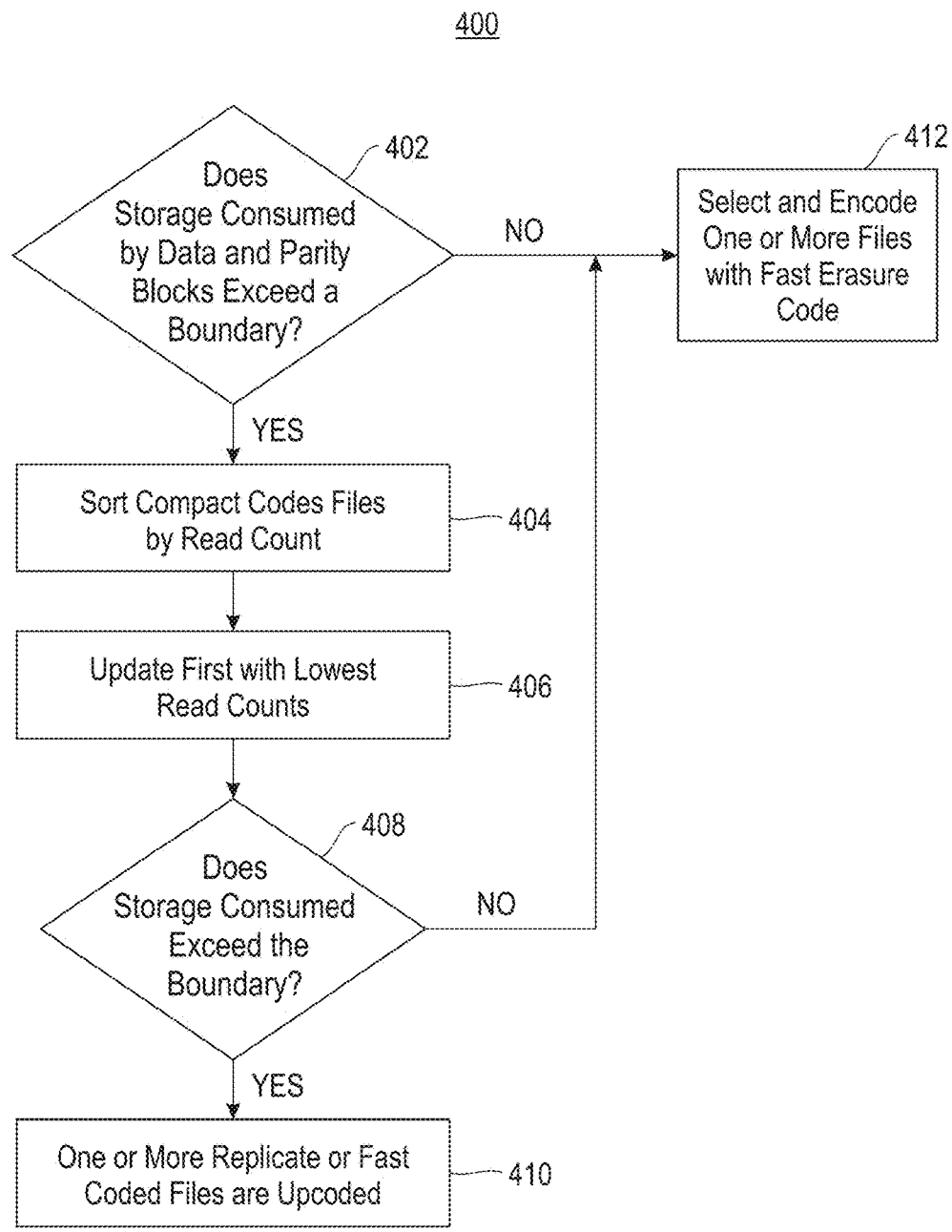
FIG. 4 depicts a flow chart illustrating a process for adapting to the workload and dynamically converting files between fast and compact codes.

Referring to FIG. 4, a flow chart (400) is provided illustrating a process for adapting to the workload and dynamically converting files between fast and compact codes. The conversion for a file is guided by its own file state, e.g. read count, as well as the global system state, e.g. total storage. It is initially determined if the storage consumed by data and parity blocks exceed a boundary (402). A positive response to the determination at step (402) initiates upcoding of one of more fast coded files to reduce storage space. The files that have compact codes are sorted based on their read counts (404). One or more files with the lowest read counts are upcoded from the fast erasure code to the compact erasure code (406). Following step (406), the process repeats the assessment at step (402), namely to assess for storage consumption with respect to the boundary (408). More specifically, the repeated assessment at step (408) ascertains if additional storage space is required in view of the upcoding at step (406). If there is a need for additional storage space, one or more replicated files are selected and encoded directly into the compact erasure code, and if necessary, one or more replicated or fast coded files are upcoded to the compact erasure code (410). In one embodiment, the file(s) selected at step (410) are based on their read count(s), with the file with the lowest read counts selected for upcoding to the compact erasure code to make the total storage overhead bounded again. If at step (402) it is determined that the storage consumed does not exceed the boundary of the storage overhead or if at step (408) it is determined that the storage consumed does not exceed the boundary, one or more files may be selected and transitioned from compact encoding to the fast erasure code (412). In one embodiment, the file(s) selected at step (412) may be based on an associated read count, and specifically on when the last read access took place. The conversion of the files to the fast erasure code reduces the recovery cost of a future degraded read to a file, which was earlier compact coded, but in one embodiment has recently been accessed.

Figure 5:
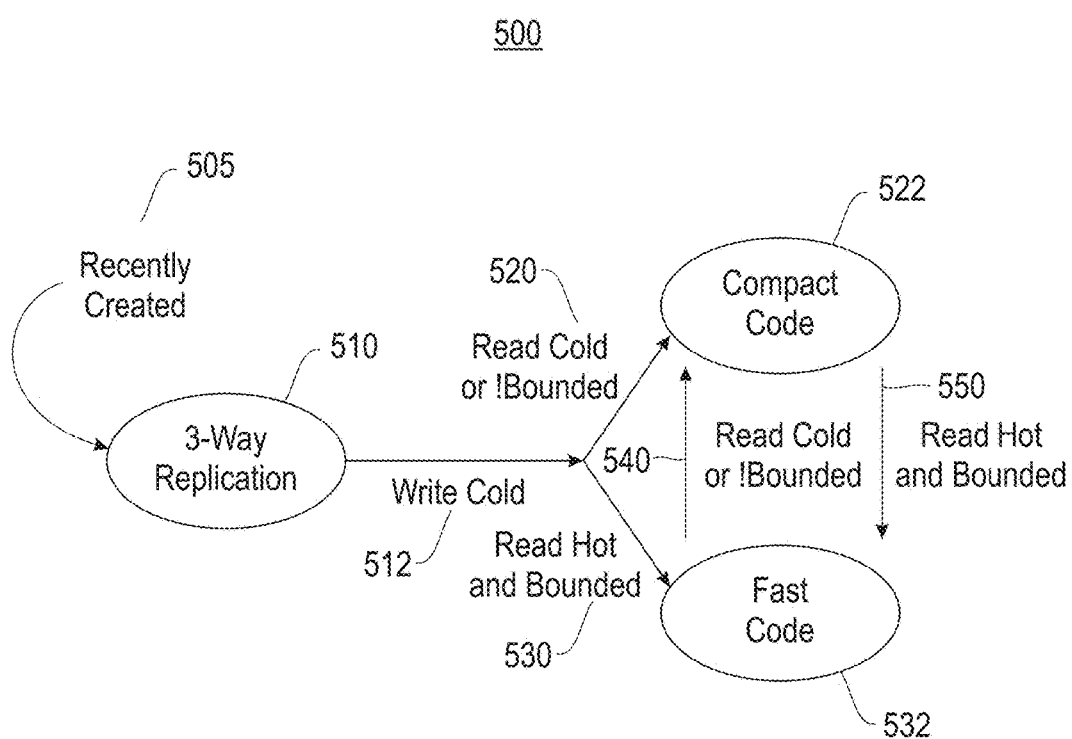
FIG. 5 depicts a state diagram illustrating an adaptive coding module for a file that has been three-way replicated.

Referring to FIG. 5, a state diagram (500) is provided illustrating an adaptive coding module for a recently created file (505) that has been three way replicated (510). Similar to FIG. 3, at such time as modifications to the file decreases, the file is reclassified to a write cold file (512). Each write cold file is encoded with an erasure code based on the read accesses, also referred to herein as a read count. At the same time, the encoding also addresses the storage capacity boundary. Namely, a read cold file (520) is encoded with a compact code (522) in view of the state of the storage system capacity, and a read hot file (530) is encoded with a fast code (532) also in view of the state of the storage system capacity. The state diagram shown herein is adaptive, and responds to the capacity of the storage system. At such time as the storage capacity has reached or exceeds its threshold, e.g. boundary, modifications to one or more files take place, as shown and described in FIG. 4. More specifically, one or more read cold files that were fast encoded are compact encoded (540). Similarly, at such time as the storage capacity is within its boundary, one or more read cold files that were compact encoded files may be selected and fast encoded (550). The state diagram functions as a temperature measurement with respect to storage capacity, and dynamically converts select files between the two erasure codes to balance recovery cost with storage overhead. The adaptive coding module tracks the system states and invokes the different coding interfaces. Accordingly, the state diagram illustrates employing the erasure codes to adapt with workload changes and system storage by converting between fast and compact codes.

Figure 6:
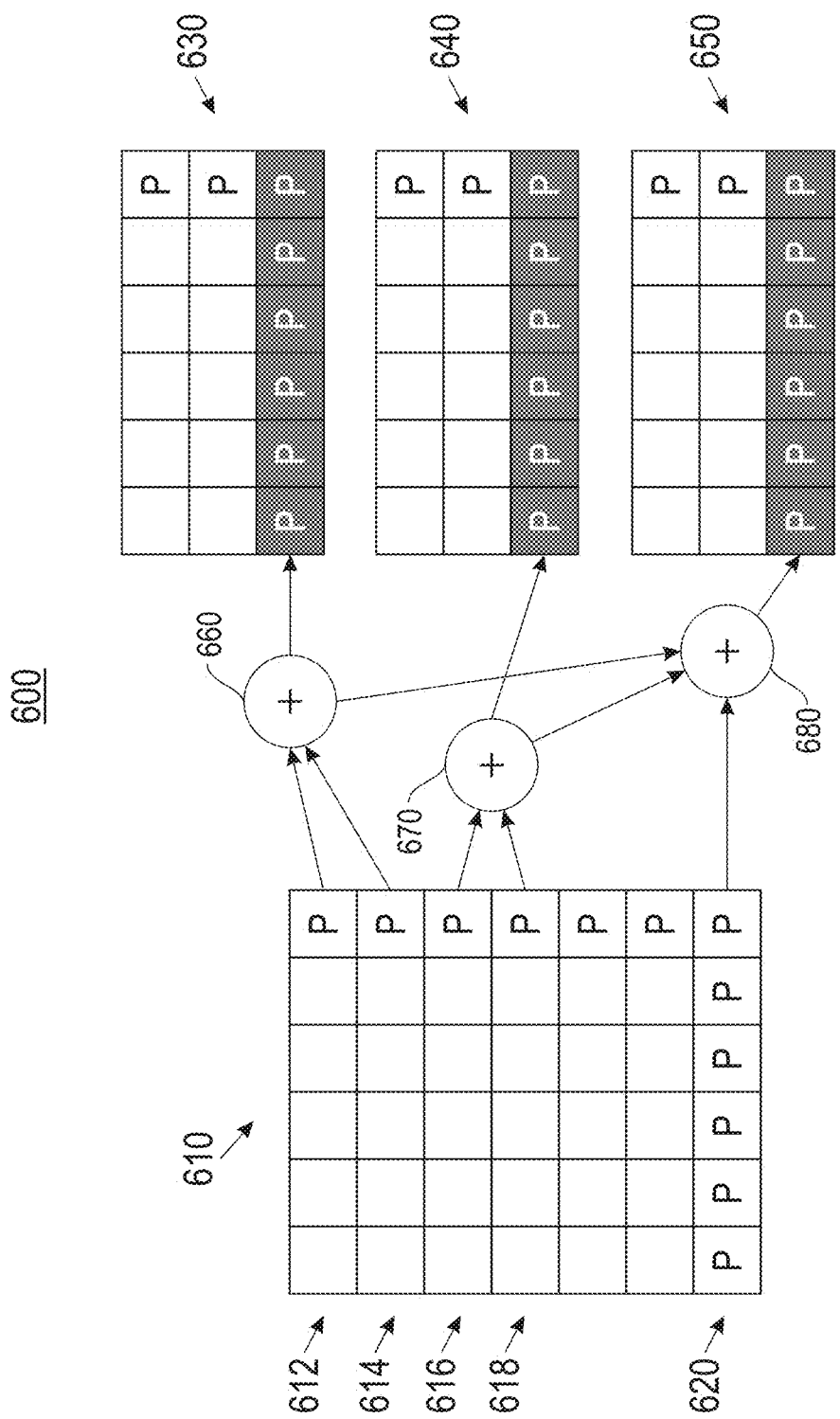
FIG. 6 depicts a block diagram illustrating downcoding product codes from compact to fast, also referred to herein as from $PC_{comp}$ to $PC_{fast}$.

Two new code families are employed as part of the adaptive file system erasure coding module, including product codes and local reconstruction codes. Product codes are two dimensional codes that provide low recovery cost. Referring to FIG. 6, a block diagram (600) is provided illustrating downcoding product codes from compact to fast, also referred to herein as from $PC_{comp}$ to $PC_{fast}$. The downcoding operation converts a single $PC_{comp}$ code (610) into three $PC_{fast}$ codes (630), (640), and (650). Only the horizontal and global parity blocks change between the $PC_{comp}$ (610) and the three $PC_{fast}$ codes (630), (640), and (650). As shown, computing the horizontal and global parity blocks in the first two $PC_{fast}$ codes (630) and (640) requires network transfers and exclusive OR (hereinafter XOR) operations (660) and (670) over the data blocks in the two horizontal rows of the $PC_{comp}$ code, namely XOR (660) for rows (612) and (614) and XOR (670) for rows (616) and (618). The horizontal and global parity blocks in the third $PC_{fast}$ code (650) is computed through an XOR operation (680) from the horizontal and global parity blocks (620) and the newly computed XOR operations at (660) and (670) of the first two $PC_{fast}$ codes (630) and (640). This optimization saves on the network transfers of two horizontal rows of data blocks. Data and vertical parity blocks in the resulting three $PC_{fast}$ codes (630), (640), and (650) remain unchanged from the $PC_{comp}$ code (610) and do not require any network transfers. Accordingly, as shown herein downcoding from a compact code to a fast code only requires vertical parities to be recomputed.

Figure 7:
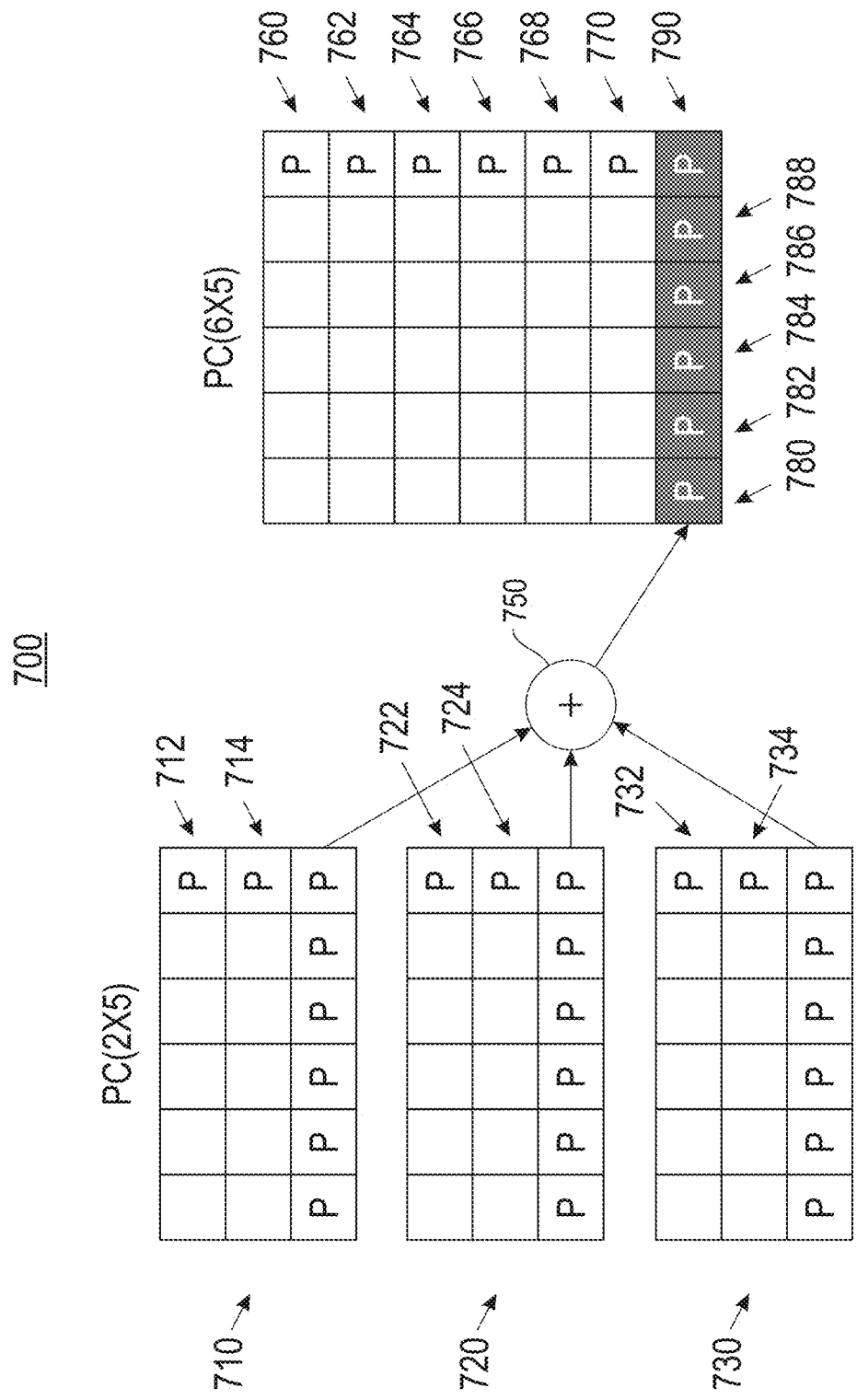
FIG. 7 depicts a block diagram illustrating upcoding from $PC_{fast}$ to $PC_{comp}$.

Referring to FIG. 7, a block diagram (700) is provided illustrating upcoding from $PC_{fast}$ to $PC_{comp}$. Upcoding is shown herein as an efficient parity only conversion operation for product codes. The upcode process performs XOR (750) over the old horizontal and global parity blocks of three $PC_{fast}$ (710), (720), (730) codes to compute the new horizontal parity blocks (780), (782), (784), (786), and (788) and the global parity block (790). New vertical parity blocks (760), (762), (764), (766), (768), and (770) are computed from the old vertical parities (712) and (714), (722) and (724), and (732) and (734), e.g. the vertical parities remain the same. Accordingly, the upcoding operation does not require any network transfers of the data blocks from the three $PC_{fast}$ codes to compute the new parities in the $PC_{comp}$ code.

Figure 8:
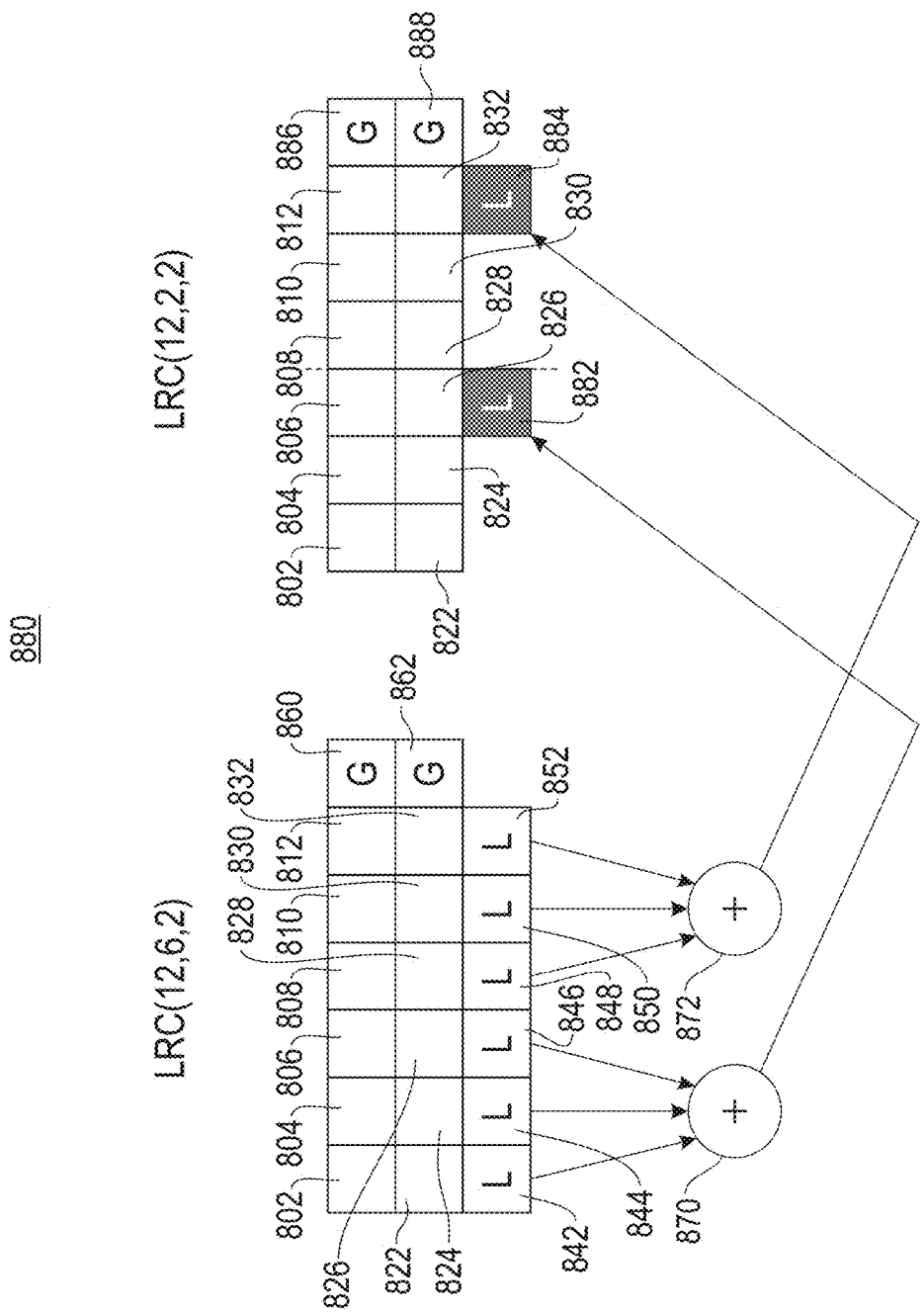
FIG. 8 depicts a block diagram illustrating construction and coding interfaces of the erasure coding module using local reconstruction codes (LRC).

Referring to FIG. 8, a block diagram (800) is provided illustrating construction and coding interfaces of the erasure coding module using local reconstruction codes (LRCs). More specifically, the example construction of the $LRC_{fast}$ codes is shown with twelve data blocks (802)-(832), six local parity blocks (842)-(852), and two global parity blocks (860) and (862). The encode operation of the LRC code computes the local parities by performing two XOR operations, each over a group of parity blocks. A first XOR (870) is performed over the parity blocks (842), (844), and (846), and a second XOR (872) is performed over parity blocks (846), (848), and (850). Namely, two local parities (882) and (884) in the $LRC_{comp}$ code are computed as an XOR over three local parities (842), (844), (846), and (848), (850), and (852) in the $LRC_{fast}$ code. As a result, the adaptive system requires only six network transfers to compute the two new local parities if the $LRC_{comp}$ code in an upcode operation.

The two global parity blocks (860) and (862) are computed by performing a Reed-Solomon encoding over all of the twelve data blocks (802)-(832). The $LRC_{comp}$ representation is shown at (880) with the same twelve data blocks (802)-(832), two local parity blocks (882) and (884), and two global parity blocks (886) and (888). As shown, a single local parity block (882) is the XOR of data blocks (802), (804), (806), (822), (824), and (826), and a single local parity block (884) is the XOR of data blocks (808), (810), (812), (828), (830), and (832). Any single failure in data or local parity blocks for $LRC_{fast}$ requires two block transfer from the same column for reconstruction. However, a failure in a global parity block requires all twelve data blocks for reconstruction.

Figure 9:
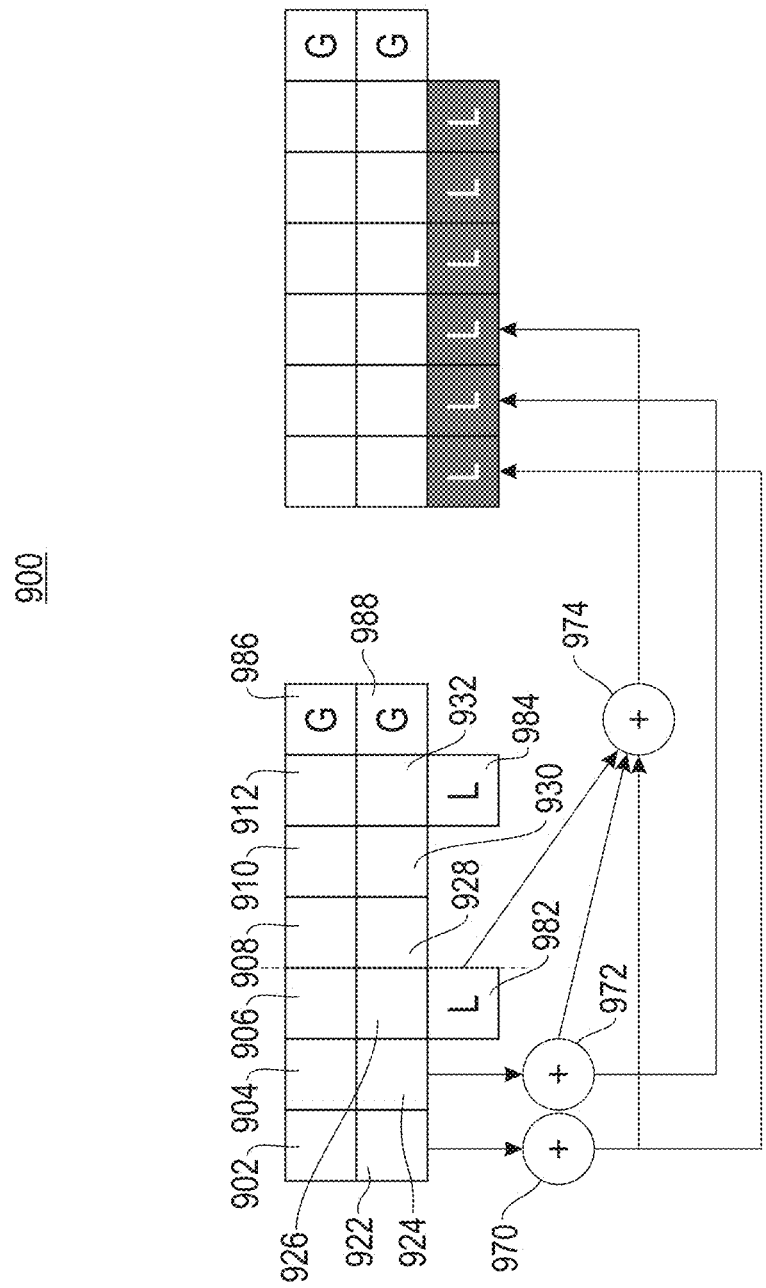
FIG. 9 depicts a block diagram illustrating downcoding from $LRC_{comp}$ to $LRC_{fast}$.

Referring to FIG. 9, a block diagram (900) is provided illustrating downcoding from $LRC_{comp}$ to $LRC_{fast}$. Each of two local parity blocks (982) and (984) is associated with a group of six data blocks. Namely, local parity block (982) is associated with data blocks (902), (904), (906), (922), (924), and (926), and local parity block (984) is associated with data blocks (908), (910), (912), (928), (930), and (932). Recovering a lost data block or local parity requires six block transfers from its group in the $LRC_{comp}$ code. As a result, the $LRC_{comp}$ code also has a lower recovery cost for degraded reads. Two of the three new local parities in the $LRC_{fast}$ code are computed at (970) and (972) from the data blocks in the individual columns of the $LRC_{comp}$ code. The third local parity is computed (974) by performing an XOR over the two new local parities and the old local parity (982) in the $LRC_{comp}$ code. The downcode operation requires ten block transfers for computing the new local parities. The global parities (986) and (988) remain unchanged and do not require any network transfers.

Upcode and downcode operations for the LRC codes are similar to that of the product codes. However, upcoding and downcoding with LRC codes requires several data block transfers to compute the new local and global parities. As shown in the description of the product and local reconstruction codes, the upcoding operation either merges three fast codes for product codes or collapses one fast code for LRC codes into a new compact code of smaller size. Downcoding performs the reverse sequence of steps. Both operations change the coding state of the data file and reduce its replication level to one.

The tools shown and described herein support dynamically selecting an erasure code in a storage system, and adaptively converting data between the erasure codes based on system measurements. In one embodiment, the functionality and support of the erasure codes and the associated conversion between the codes may be extrapolated to a cloud computing environment with a shared pool of resources.

Figure 10:
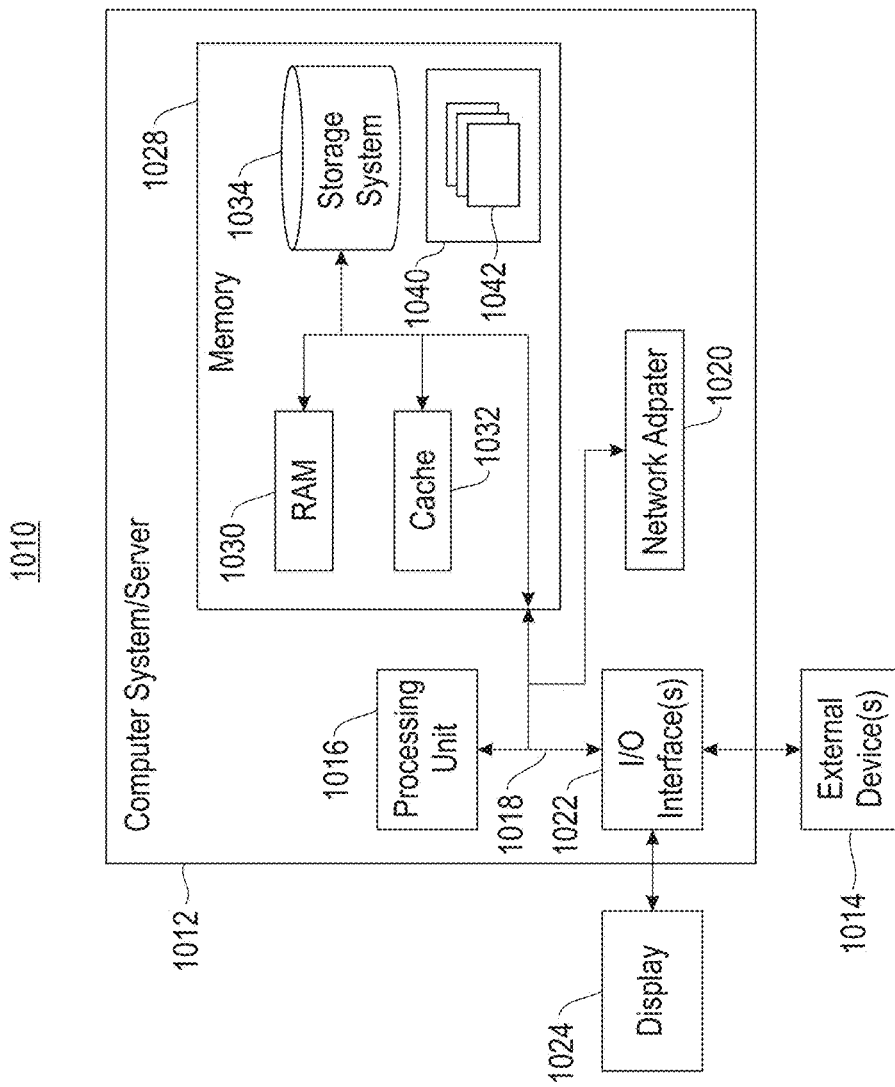
FIG. 10 depicts an example of a cloud computing node.

A cloud computing environment is service oriented with a focus on statelessness, low coupling, modularity, and semantic interoperability. At the heart of cloud computing is an infrastructure comprising a network of interconnected nodes. Referring now to FIG. 10, a schematic of an example of a cloud computing node is shown. Cloud computing node (1010) is only one example of a suitable cloud computing node and is not intended to suggest any limitation as to the scope of use or functionality of embodiments described herein. Regardless, cloud computing node (1010) is capable of being implemented and/or performing any of the functionality set forth hereinabove. In cloud computing node (1010) there is a computer system/server (1012), which is operational with numerous other general purpose or special purpose computing system environments or configurations. Examples of well-known computing systems, environments, and/or configurations that may be suitable for use with computer system/server (1012) include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server (1012) may be described in the general context of computer system-executable instructions, such as program modules, being executed by a computer system. Generally, program modules may include routines, programs, objects, components, logic, data structures, and so on that perform particular tasks or implement particular abstract data types. Computer system/server (1012) may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server (1012) in cloud computing node (1010) is shown in the form of a general-purpose computing device. The components of computer system/server (1012) may include, but are not limited to, one or more processors or processing units (1016), system memory (1028), and a bus (1018) that couples various system components including system memory (1028) to processor (1016). Bus (1018) represents one or more of any of several types of bus structures, including a memory bus or memory controller, a peripheral bus, an accelerated graphics port, and a processor or local bus using any of a variety of bus architectures. By way of example, and not limitation, such architectures include an Industry Standard Architecture (ISA) bus, a Micro Channel Architecture (MCA) bus, an Enhanced ISA (EISA) bus, Video Electronics Standards Association (VESA) local bus, and a Peripheral Component Interconnects (PCI) bus. A computer system/server (1012) typically includes a variety of computer system readable media. Such media may be any available media that is accessible by a computer system/ server (1012), and it includes both volatile and non-volatile media, and removable and non-removable media.

System memory (1028) can include computer system readable media in the form of volatile memory, such as random access memory (RAM) (1030) and/or cache memory (1032). Computer system/server (1012) may further include other removable/non-removable, volatile/non-volatile computer system storage media. By way of example only, storage system (1034) can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus (1018) by one or more data media interfaces. As will be further depicted and described below, memory (1028) may include at least one program product having set (e.g., at least one) of program modules that are configured to carry out the functions of the embodiment(s).

Program/utility (1040), having a set (at least one) of program modules (1042), may be stored in memory (1028) by way of example, and not limitation, as well as an operating system, one or more application programs, other program modules, and program data. Each of the operating systems, one or more application programs, other program modules, and program data or some combination thereof, may include an implementation of a networking environment. Program modules (1042) generally carry out the functions and/or methodologies of embodiments as described herein.

Computer system/server (1012) may also communicate with one or more external devices (1014), such as a keyboard, a pointing device, a display (1024), etc.; one or more devices that enable a user to interact with computer system/server (1012); and/or any devices (e.g., network card, modem, etc.) that enables computer system/server (1012) to communicate with one or more other computing devices. Such communication can occur via Input/Output (I/O) interfaces (1022). Still yet, computer system/server (1012) can communicate with one or more networks such as a local area network (LAN), a general wide area network (WAN), and/or a public network (e.g., the Internet) via network adapter (1020). As depicted, network adapter (1020) communicates with the other components of computer system/server (1012) via bus (1018). It should be understood that although not shown, other hardware and/or software components could be used in conjunction with computer system/server (1012). Examples, include, but are not limited to: microcode, device drivers, redundant processing units, external disk drive arrays, RAID systems, tape drives, and data archival storage systems, etc.

Figure 11:
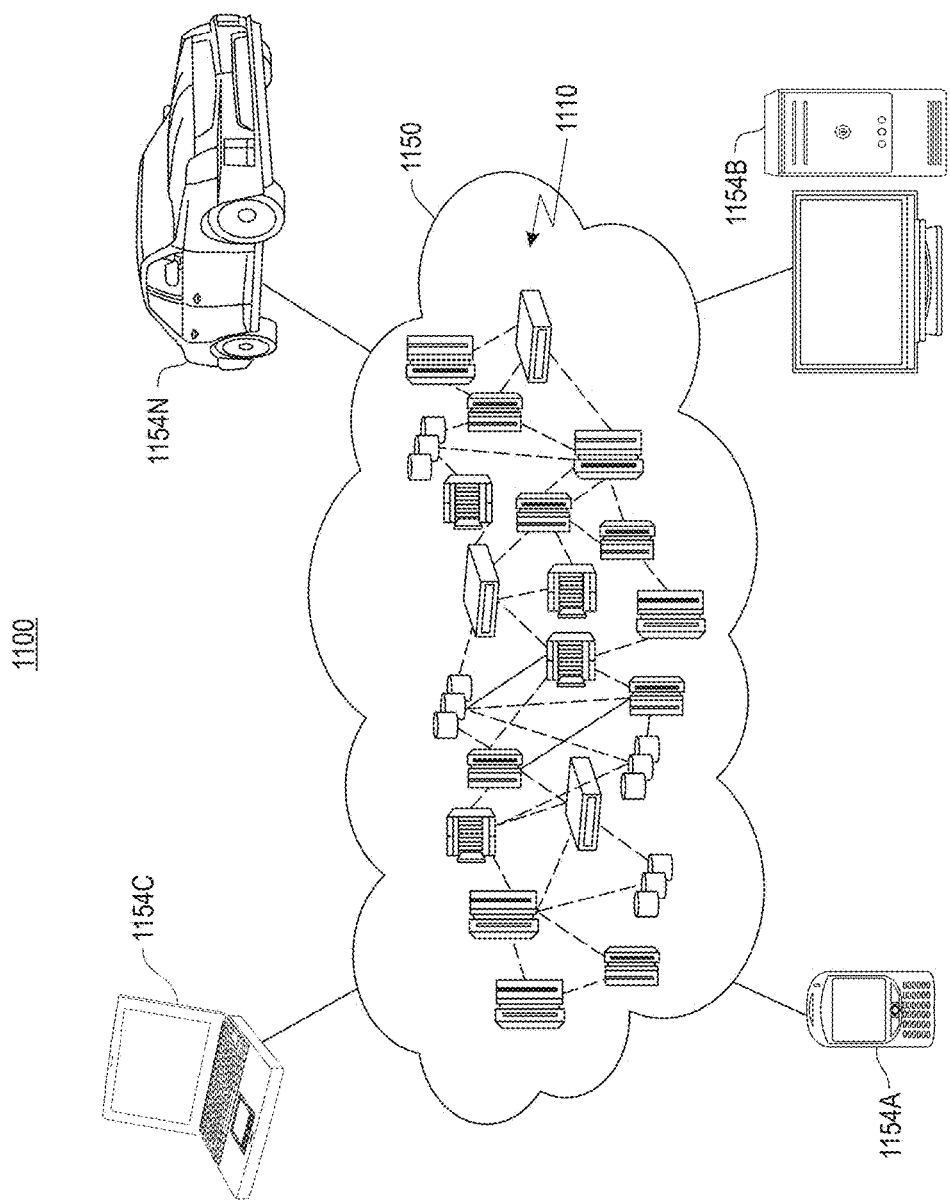
FIG. 11 depicts a cloud computing environment.

Referring now to FIG. 11, illustrative cloud computing environment (1150) is depicted. As shown, cloud computing environment (1150) comprises one or more cloud computing nodes (1110) with which local computing devices used by cloud consumers, such as, for example, personal digital assistant (PDA) or cellular telephone (1154A), desktop computer (1154B), laptop computer (1154C), and/or automobile computer system (1154N) may communicate. Nodes (1110) may communicate with one another. They may be grouped (not shown) physically or virtually, in one or more networks, such as Private, Community, Public, or Hybrid clouds as described hereinabove, or a combination thereof. This allows cloud computing environment (1150) to offer infrastructure, platforms, and/or software as services for which a cloud consumer does not need to maintain resources on a local computing device. It is understood that the types of computing devices (1154A)-(1154N) shown in FIG. 11 are intended to be illustrative only and that computing nodes (1110) and cloud computing environment (1150) can communicate with any type of computerized device over any type of network and/or network addressable connection (e.g., using a web browser).

Figure 12:
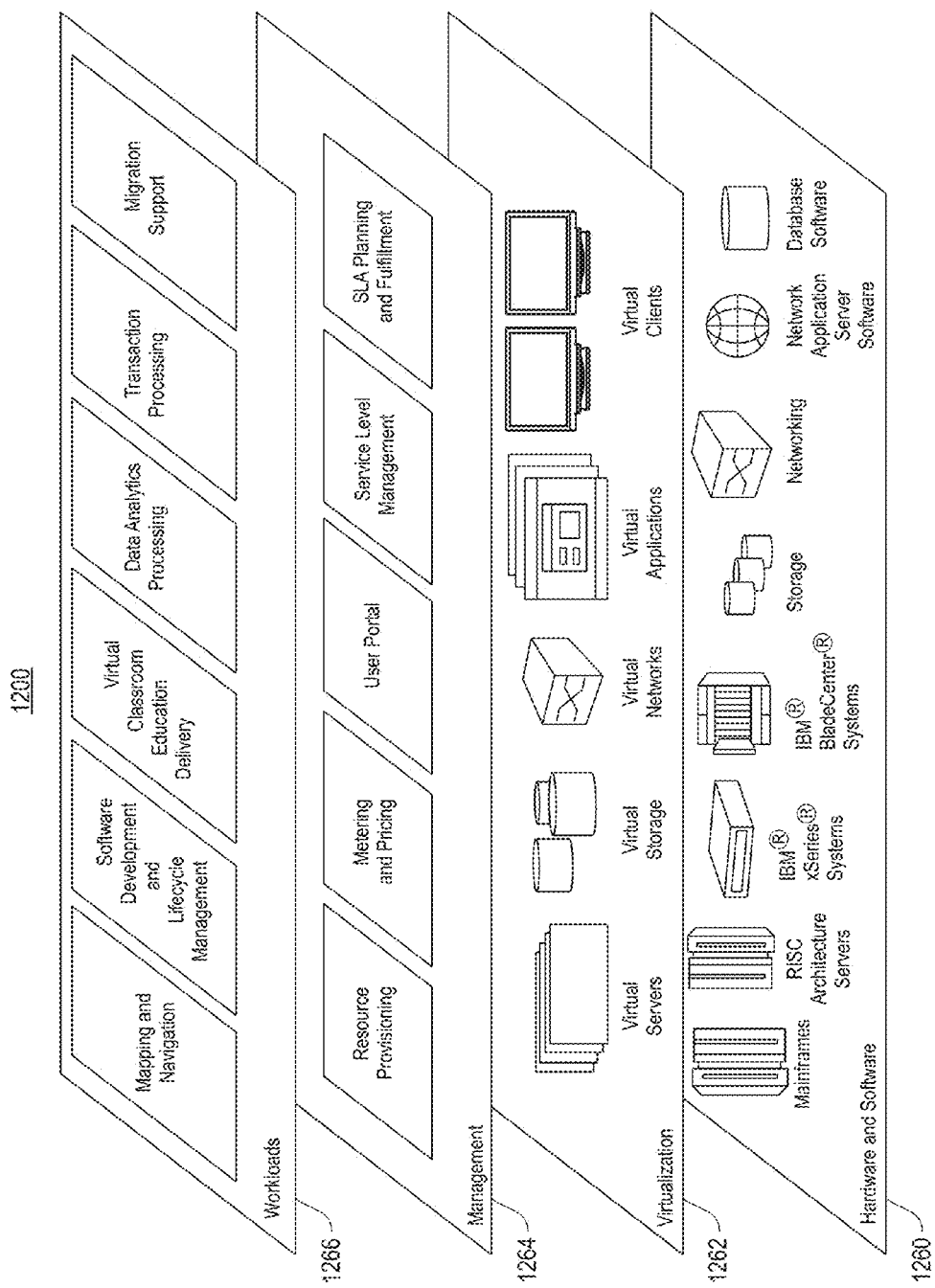
FIG. 12 depicts a set of functional abstraction layers provided by the cloud computing environment.

Referring now to FIG. 12, a set of functional abstraction layers provided by cloud computing environment (1200) is shown. It should be understood in advance that the components, layers, and functions shown in FIG. 12 are intended to be illustrative only and embodiments are not limited thereto. As depicted, the following layers and corresponding functions are provided: hardware and software layer (1210), virtualization layer (1220), management layer (1230), and workload layer (1240). The hardware and software layer (1210) includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer (1220) provides an abstraction layer from which the following examples of virtual entities may be provided: virtual servers; virtual storage; virtual networks, including virtual private networks; virtual applications and operating systems; and virtual clients.

In one example, a management layer (1230) may provide the following functions: resource provisioning, metering and pricing, user portal, service level management, and key management. The functions are described below. Resource provisioning provides dynamic procurement of computing resources and other resources that are utilized to perform tasks within the cloud computing environment. Metering and pricing provides cost tracking as resources that are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Key management provides cloud computing and sharing of data among two or more entities such that required encryption and management of associated encrypted data are met.

Workloads layer (1240) provides examples of functionality for which the cloud computing environment may be utilized. In the shared pool of configurable computer resources described herein, hereinafter referred to as a cloud computing environment, files may be shared among users within multiple data centers, also referred to herein as data sites. Accordingly, a series of mechanisms are provided within the shared pool to support organization and management of data storage within the cloud computing environment.

As will be appreciated by one skilled in the art, aspects of the present embodiment(s) may be embodied as a system, method, or computer program product. Accordingly, aspects of the present embodiment(s) may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present embodiment(s) may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present embodiment(s) may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present embodiment(s) are described above with reference to flow chart illustrations and/or block diagrams of methods, apparatus (systems), and computer program products according to embodiments. It will be understood that each block of the flow chart illustrations and/or block diagrams, and combinations of blocks in the flow chart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow charts and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function(s)/act(s) specified in the flow chart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions, which execute on the computer or other programmable apparatus, provide processes for implementing the functions/acts specified in the flow chart and/or block diagram block or blocks.

The flow charts and block diagrams in the Figures illustrate the architecture, functionality, and operation of possible implementations of systems, methods, and computer program products according to various embodiments. In this regard, each block in the flow charts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flow chart illustration(s), and combinations of blocks in the block diagrams and/or flow chart illustration(s), can be implemented by special purpose hardware-based systems that perform the specified functions or acts, or combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present embodiment(s) may be a system, a method, and/or a computer program product. The computer program product may include a computer readable storage medium (or media) having computer readable program instructions thereon for causing a processor to carry out aspects.

Computer readable program instructions described herein can be downloaded respective computing/processing devices from a computer readable storage medium or to an external computer or external storage device via a network, for example, the Internet, a local area network, a wide area network and/or a wireless network. The network may comprise copper transmission cables, optical transmission fibers, wireless transmissions, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Aspects of the present embodiments are described herein with reference to flow chart illustrations and/or block diagrams of methods, apparatus (systems), and computer program products according to embodiments. It will be understood that each block of the flow chart illustrations and/or block diagrams, and combinations of blocks in the flow chart illustrations and/or block diagrams, can be implemented by computer readable program instructions.

The corresponding structures, materials, acts, and equivalents of all means or step plus function elements in the claims below are intended to include any structure, material, or act for performing the function in combination with other claimed elements as specifically claimed. The description of the present embodiment(s) has been presented for purposes of illustration and description, but is not intended to be exhaustive or limited to the form disclosed. Many modifications and variations will be apparent to those of ordinary skill in the art without departing from the scope and spirit. The embodiment was chosen and described in order to best explain the principles and the practical application, and to enable others of ordinary skill in the art to understand the various embodiments with various modifications as are suited to the particular use contemplated. Accordingly, the implementation of two or more erasure codes and specifically the dynamic manner in which data is encoded and adaptively converted to a different code provides a new and efficient interface for achieving improved recovery cost and storage efficiency.

It will be appreciated that, although specific embodiments have been described herein for purposes of illustration, various modifications may be made without departing from the spirit and scope. Accordingly, the scope of protection is limited only by the following claims and their equivalents.

What is claimed is:
1. A computer system comprising:
a processor in communication with data storage;
a tool in communication with the processor to dynamically select an erasure code, including:
a system states module to track state data to ascertain frequency of file access;
an adaptive coding module to select one of at least two erasure codes based on the tracked state data, the selection to lower data recovery cost, the at least two erasure codes selected from the group consisting of: a product code and a local reconstruction code, each erasure code including a mode selected from the group consisting of: a fast code and a compact code, the fast code having a low recovery cost and the compact code having a low storage overhead for less frequently accessed data;
an encoding module to encode the data with one of the selected erasure codes and one of the modes of the selected erasure code; and the adaptive coding module to dynamically convert data blocks between the fast and compact codes of the selected erasure code responsive to a workload change.

2. The system of claim 1, further comprising the adaptive coding module to dynamically convert between fast and compact local reconstruction code data blocks and dynamically convert between fast and compact product code data blocks, wherein the converting changes a coding state of an associated data file.

3. The system of claim 2, further comprising the adaptive coding module to downcode data blocks from compact product code to fast product code, wherein downcoding is limiting to re-computing of vertical parities.

4. The system of claim 2, further comprising the adaptive coding module to upcode data blocks from fast product code to compact product code, wherein upcoding is limited to a parity only conversion operation.

5. The system of claim 2, further comprising the adaptive coding module to downcode data blocks from compact local reconstruction code to fast local reconstruction code, wherein downcoding is limited to computing new local parities.

6. The system of claim 2, further comprising the adaptive coding module to upcode data blocks from fast local reconstruction code to compact local reconstruction code, wherein upcoding includes computing new local and global parities.

7. A computer program product for dynamically selecting an erasure code in a storage system, the computer program product comprising a computer readable storage device having program code embodied therewith, the program code executable by a processing unit to:
track a state data to ascertain frequency of file access;
select one of at least two erasure codes based on the tracked state data, the selection to lower data recovery cost, the at least two erasure codes selected from the group consisting of: a product code and a local reconstruction code, each erasure code including a mode selected from the group consisting of: a fast code and a compact code, the fast code having a low recovery cost and the compact code having a low storage overhead for less frequently accessed data;
encode the data with one of the selected erasure codes and one of the modes of the selected erasure code; and
dynamically convert data blocks between the fast and compact codes of the selected erasure code responsive to a workload change.

8. The computer program product of claim 7, further comprising program code to dynamically convert between fast and compact local reconstruction code data blocks and dynamically convert between fast and compact product code data blocks, wherein the converting changes a coding state of an associated data file.

9. The computer program product of claim 8, further comprising program code to downcode data blocks from compact product code to fast product code, wherein downcoding is limiting to re-computing of vertical parities.

10. The computer program product of claim 8, further comprising program code to upcode data blocks from fast product code to compact product code, wherein upcoding is limited to a parity only conversion operation.

11. The computer program product of claim 8, further comprising program code to downcode data blocks from compact local reconstruction code to fast local reconstruction code, wherein downcoding is limited to computing new local parities.

12. The computer program product of claim 8, further comprising program code to upcode data blocks from fast local reconstruction code to compact local reconstruction code, wherein upcoding includes computing new local and global parities.

13. A method comprising:
   tracking, by a system module, state data to ascertain frequency of file access;
   selecting, by an erasure coding module, one of at least two erasure codes based on the tracked state data, the selection to lower data recovery cost, the at least two erasure codes selected from the group consisting of: a product code and a local reconstruction code, each erasure code including a mode selected from the group consisting of: a fast code and a compact code, the fast code having a low recovery cost and the compact code having a low storage overhead for less frequently accessed data;
   encoding, by the erasure coding module, the data with one of the selected erasure codes and one of the modes of the selected erasure code; and
   dynamically converting, by an adaptive coding module, data blocks between the fast and compact codes of the selected erasure code responsive to a workload change.

14. The method of claim 13, further comprising dynamically converting, by the adaptive coding module, between fast and compact local reconstruction code data blocks and dynamically converting between fast and compact product code data blocks, wherein the converting changes a coding state of an associated data file.

15. The method of claim 14, further comprising downcoding data blocks, by the erasure coding module, from compact product code to fast product code, wherein the downcoding is limiting to re-computing of vertical parities.

16. The method of claim 14, further comprising upcoding data blocks by the erasure coding module, from fast product code to compact product code, wherein the upcoding is limited to a parity only conversion operation.

17. The method of claim 14, further comprising downcoding data blocks, by the adaptive coding module, from compact local reconstruction code to fast local reconstruction code, wherein the downcoding is limited to computing new local parities.

18. The method of claim 14, further comprising upcoding data blocks by the adaptive coding module, from fast local reconstruction code to compact local reconstruction code, wherein the upcoding includes computing new local and global parities.

* * * * *